(12) United States Patent
Natarajan et al.

(10) Patent No.: US 11,818,872 B2
(45) Date of Patent: *Nov. 14, 2023

(54) ELECTRICAL DEVICES WITH BUOYANCY-ENHANCED COOLING

(71) Applicant: Vertiv Corporation, Columbus, OH (US)

(72) Inventors: Srinivasan Natarajan, Erode (IN); Utkarsh D Charapale, Pune (IN)

(73) Assignee: Vertiv Corporation, Columbus, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/977,400

(22) Filed: Oct. 31, 2022

(65) Prior Publication Data

US 2023/0047012 A1    Feb. 16, 2023

Related U.S. Application Data

(63) Continuation of application No. 17/307,505, filed on May 4, 2021, now Pat. No. 11,523,547.

(51) Int. Cl.
*H05K 7/20*    (2006.01)
*H02M 7/00*    (2006.01)

(52) U.S. Cl.
CPC ........ *H05K 7/20909* (2013.01); *H02M 7/003* (2013.01); *H05K 7/20145* (2013.01)

(58) Field of Classification Search
CPC ..... H01L 23/467; H01L 23/3672; G06F 1/20; F28D 15/0233; F28D 1/0233;

(Continued)

(56) References Cited

U.S. PATENT DOCUMENTS

| 4,523,636 A | 6/1985 | Meijer et al. |
| 5,063,009 A | 11/1991 | Mizutani et al. |

(Continued)

FOREIGN PATENT DOCUMENTS

| CN | 203523220 U | 4/2014 |
| JP | H05-099550 A | 4/1993 |

(Continued)

OTHER PUBLICATIONS

PCT International Search Report and Written Opinion for PCT/US2022/027505 filed May 3, 2022 which claims priority to the instant application; dated Aug. 23, 2022; 7 pages.

*Primary Examiner* — Mandeep S Buttar
(74) *Attorney, Agent, or Firm* — Harness, Dickey & Pierce, P.L.C.

(57) ABSTRACT

An electrical device with buoyancy-enhanced cooling is provided. The electrical device includes a housing having a first portion including a heat sink and a second portion coupled to the first portion. The heat sink includes a plurality of hollow fins. A cover plate is positioned within the housing and is coupled to the first portion of the housing. The cover plate defines openings between an interior of the housing and the plurality of hollow fins and the openings are located at each end of each hollow fin. Further, an electrical component is positioned within the interior of the housing. Air heated by the electrical component is permitted to circulate within the housing and is directed through the hollow fins based on buoyancy forces (e.g., such that the air is permitted to cool within the hollow fins based on conduction, convection, and/or radiation).

20 Claims, 8 Drawing Sheets

(58) Field of Classification Search
CPC ............. F28D 1/024; F28D 2021/0029; F28D 1/0535; F28F 2215/06; F28F 3/12; F28F 3/02; F28F 13/12; F28F 13/02; H05K 7/20409; H05K 7/20918; H05K 7/20009; H05K 7/20127; H05K 7/20163; H05K 7/20418; H05K 7/209; H05K 7/20145; H05K 7/1427; H05K 5/06
USPC .......................................................... 361/690
See application file for complete search history.

(56) References Cited

U.S. PATENT DOCUMENTS

| | | | |
|---|---|---|---|
| 5,216,580 A * | 6/1993 | Davidson | H01L 23/427 174/15.2 |
| 2002/0021556 A1* | 2/2002 | Dibene, II | F28D 15/04 257/E23.088 |
| 2002/0056908 A1* | 5/2002 | Brownell | H01L 23/427 257/714 |
| 2007/0184320 A1 | 8/2007 | Domen | |
| 2007/0227703 A1 | 10/2007 | Bhatti et al. | |
| 2007/0258213 A1* | 11/2007 | Chen | H01L 23/427 257/E23.088 |
| 2008/0170368 A1 | 7/2008 | Chen et al. | |
| 2011/0008198 A1 | 1/2011 | Hou | |
| 2011/0297361 A1* | 12/2011 | Carbone | H01L 31/0521 165/185 |
| 2014/0231914 A1 | 8/2014 | Chang et al. | |
| 2017/0064868 A1* | 3/2017 | Rush | F28D 15/0233 |
| 2017/0164517 A1* | 6/2017 | Kim | H05K 7/20681 |
| 2021/0105912 A1 | 4/2021 | Takabayashi | |

FOREIGN PATENT DOCUMENTS

| | | |
|---|---|---|
| JP | 2011258874 A | 12/2011 |
| JP | 2014110286 A | 6/2014 |

* cited by examiner

ELECTRICAL DEVICES WITH BUOYANCY-ENHANCED COOLING

CROSS-REFERENCE TO RELATED APPLICATION

This application is a continuation of U.S. patent application Ser. No. 17/307,505 filed May 4, 2021. The entire disclosure of the above application is incorporated herein by reference.

FIELD

The present disclosure generally relates to electrical devices with buoyancy-enhanced cooling and related systems, and more particularly, to enclosures for electrical components that utilize buoyancy principles to enhance cooling of the electrical components included within the enclosures.

BACKGROUND

This section provides background information related to the present disclosure which is not necessarily prior art.

Heat sinks are often used to dissipate heat from devices, components, structures, etc. that include heat-generating elements (e.g., electrical components). Heat sinks decrease the risk of such devices overheating, where the performance of such devices are often limited by maximum allowable temperature limits. Heat can be transferred in several ways, including convection, conduction, and radiation. Convection of heat is transferred in a fluid, such as air. Convection occurs when air is heated (e.g., by a heat-generating element) and based on buoyancy principles, the heated air expands, becoming less dense, and rises. As the heated air rises and travels away from the source, it carries the thermal energy along. Conduction of heat is transferred in a solid, such as in a heat sink. Conduction occurs when two objects with different temperatures come into contact with one another. When this happens, the faster moving molecules from the warmer object give energy to the slower moving molecules, which in turn heats the cooler object. Radiation occurs when a source emits thermal energy as electromagnetic waves.

SUMMARY

This section provides a general summary of the disclosure, and is not a comprehensive disclosure of its full scope or all of its features.

Example embodiments of the present disclosure generally relate to electrical devices with buoyancy-enhanced cooling. In one example embodiment, an electrical device (e.g., a rectifier) generally includes a housing having a first portion including a heat sink and a plate coupled to the first portion. The heat sink includes a plurality of hollow fins. A cover plate is positioned within the housing and is coupled to the first portion of the housing. The cover plate defines openings between an interior of the housing and the plurality of hollow fins and the openings are located at each end of each hollow fin. Further, an electrical component is positioned within the interior of the housing. Air heated by the electrical component is permitted to circulate within the housing and is directed through the hollow fins based on buoyancy forces (e.g., such that the air is permitted to cool within the hollow fins based on conduction and convection).

In another example embodiment, a rectifier with buoyancy-enhanced cooling generally includes a housing having at least one sidewall section defining an interior of the housing. The housing includes a first end and a second end. An electrical component is disposed within the interior of the housing and the electrical component includes a rectifier circuit. A plurality of ducts are coupled to the at least one sidewall section of the housing and the plurality of ducts extend from the first end of the housing to the second end of the housing. The plurality of ducts are configured to direct air from the interior of the housing at the first end of the housing through the plurality of ducts to the second end of the housing based on buoyancy forces. In this way, the air is permitted to cool within the plurality of ducts through convection and conduction.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments of the present disclosure generally relate to electrical devices with buoyancy-enhanced cooling. Example embodiments will now be described more fully with reference to the accompanying drawings. The description and specific examples included herein are intended for purposes of illustration only and are not intended to limit the scope of the present disclosure.

FIGS. 1-10 illustrate an example embodiment of an electrical device 100 including one or more aspects of the present disclosure. In the illustrated embodiment, the electrical device 100 (e.g., a rectifier) generally includes a housing 102 and an electrical component 104 (e.g., a PCB including a rectifier circuit, etc.) positioned within the housing 102. To keep the temperature (e.g., a surface temperature) of the electrical component 104 within an acceptable temperature range (e.g., below a safe temperature limit), the electrical device 100 utilizes buoyancy-enhanced cooling to increase circulation of air within the housing 102 and around the electrical component 104. The structure and configurations of the housing 102 facilitate dissipation of heat (e.g., through conduction, convection, and radiation). Moreover, the electrical device 100 generally does not require power to cool the electrical device 100, for example, the electrical device 100 does not include an active device (e.g., a fan, etc.) to improve the thermal efficiency of the electrical device 100. Instead, as will be described in more detail herein, the configurations of the housing 102 and related structures improve the thermal efficiency (e.g., increased convection current through buoyancy, improved heat transfer, etc.) of the electrical device 100.

Figure 1:
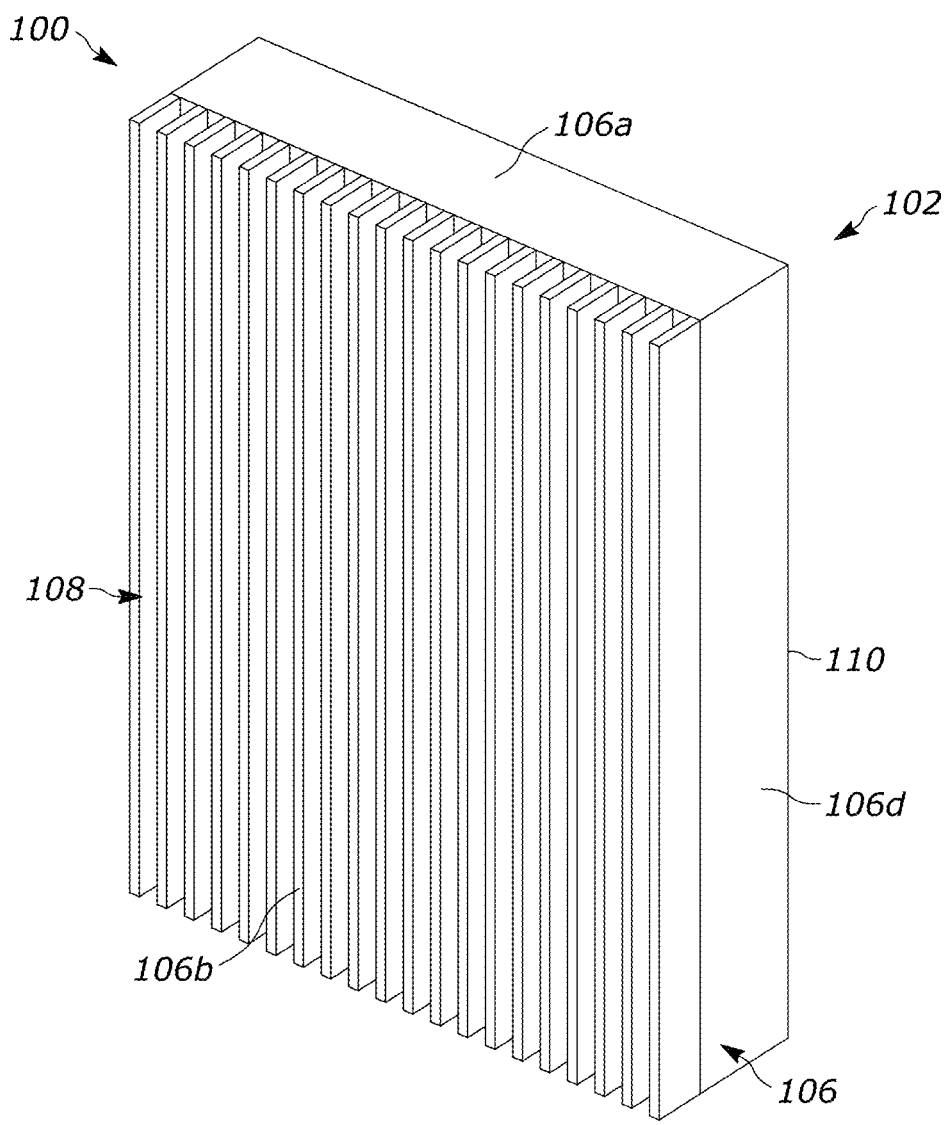
FIG. 1 is a front perspective view of an example embodiment of an electrical device.
Figure 2:
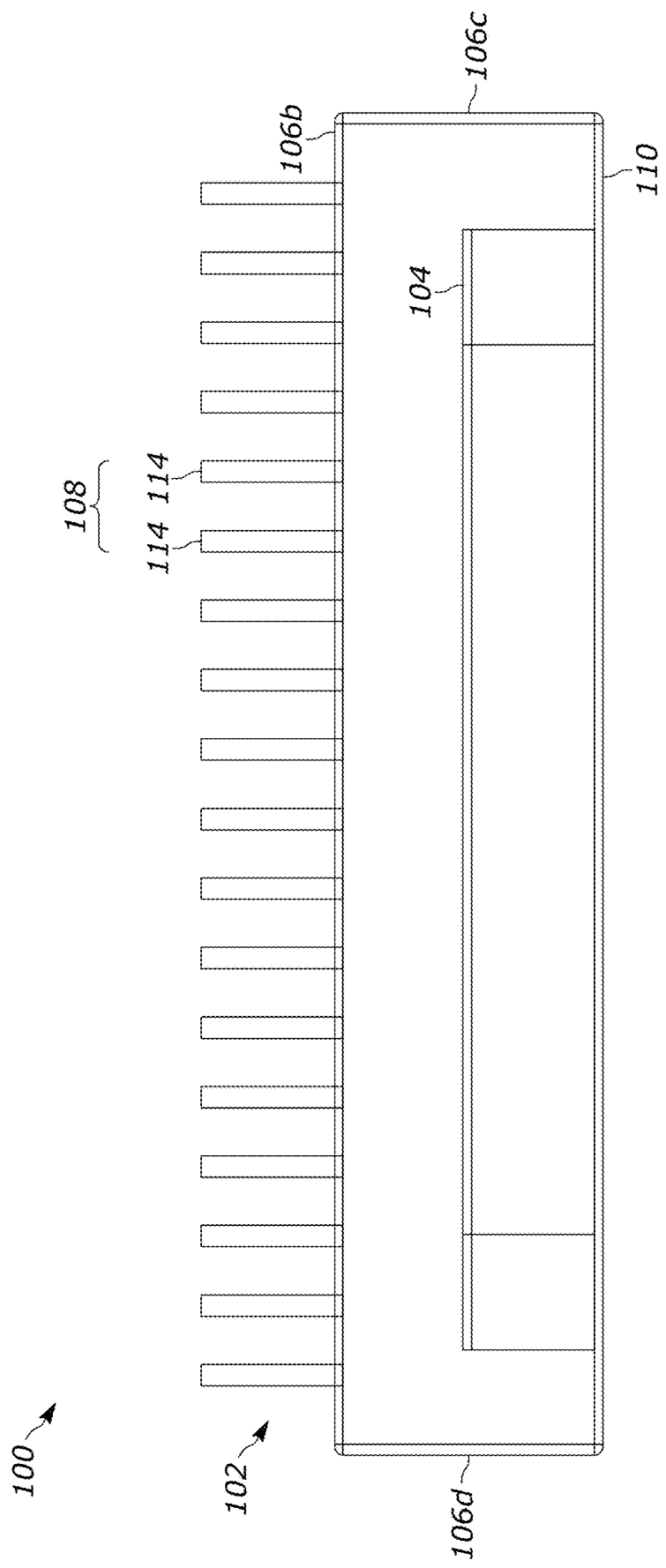
FIG. 2 is a top view of the electrical device of FIG. 1 with a top section of the housing removed to illustrate the internal components of the electrical device.
Figure 3:
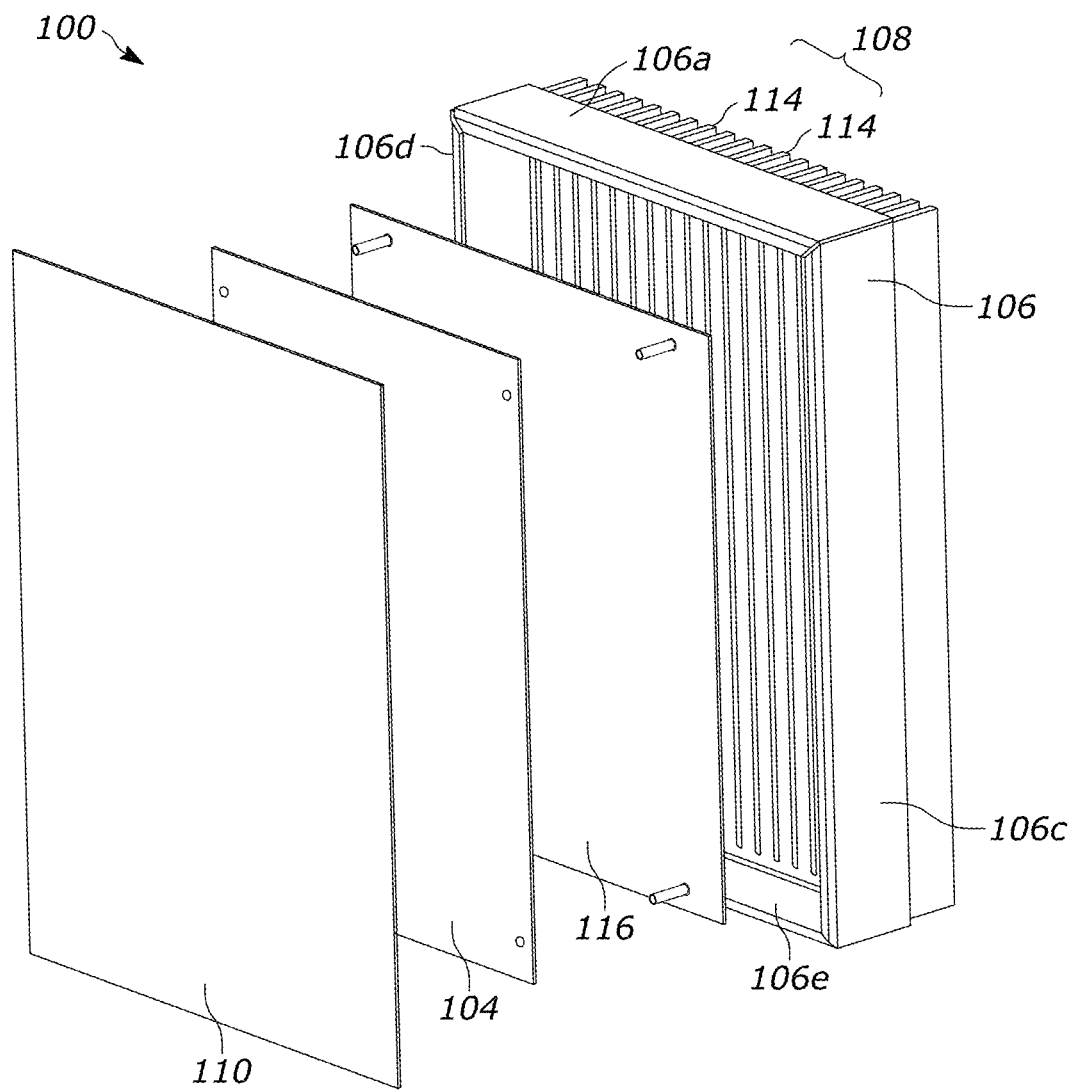
FIG. 3 is a rear perspective exploded view of the electrical device of FIG. 1.
Figure 5:
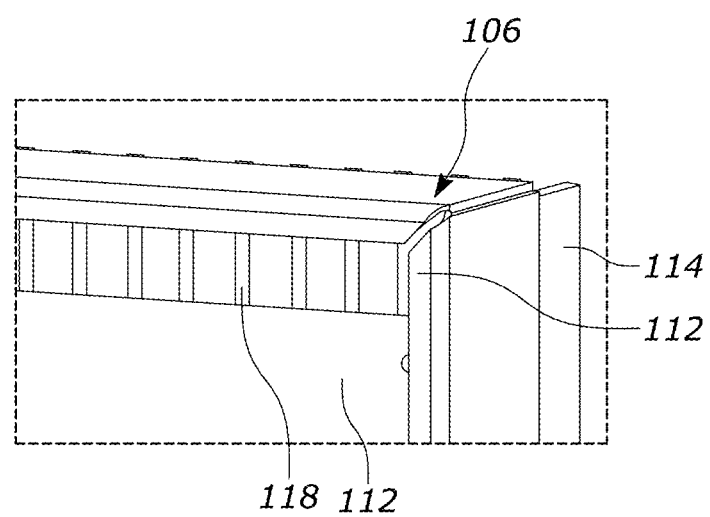
FIG. 5 is a detail view of a portion of the electrical device illustrated in FIG. 4.

The housing 102, in this embodiment, includes a first portion 106 having a heat sink 108 and a second portion 110 that is coupled to the first portion 106 and positioned opposite of the heat sink 108. The housing 102 generally includes a cuboid shape (e.g., a box or cube shape, etc.), with the first portion 106 of the housing 102 (also referred to as an outer box) formed in an open box shape and the second portion 110 of the housing 102 (also referred to as a back plate) coupled to a rear side of the first portion 106 to form a closed (e.g., sealed) box around the electrical component 104. In particular, as shown in FIG. 3, the first portion 106 includes an upper (or top) section 106a, a front section 106b including the heat sink 108, side sections 106c and 106d, and a lower (or bottom) section 106e. The second portion 110 (e.g., a back plate) is coupled to the first portion 106 and is generally positioned opposite of the front section 106b of the first portion 106. As shown in FIG. 5, the first portion 106 of the housing 102 further includes a lip 112 extending from the upper section 106a, the side sections 106c and 106d, and the lower section 106e, such that the second portion 110 may be coupled to the first portion 106 at the lip 112 to seal the electrical component 104 within the housing 102. For example, the first portion 106 of the housing 102 may be coupled to the second portion 110 of the housing 102 with an adhesive, fasteners (e.g., at each corner, etc.), etc. In some embodiments, the second portion 110 may be formed in an open box shape with the first section 106 including the heat sink 108 coupled thereto (e.g., to close the "open box"). For example, in those embodiments, the first portion 106 may include only the front section 106b of the housing 102 and the second portion 110 may additionally include an upper section (similar to upper section 106a), side sections (similar to side sections 106c and 106d), and a lower section (similar to lower section 106e). It should be appreciated that the housing 102 may include a greater or lesser number of sections formed in other configurations and shapes without departing from the scope of the present disclosure.

As described above, the front section 106b of the first portion 106 of the housing 102 includes the heat sink 108. In the illustrated embodiment, the first portion 106 of the housing 102 (including the heat sink 108) is formed by casting and consists of a single undivided piece. In other embodiments, the heat sink 108 is a separate unit that is attached to the housing 102. The heat sink 108 includes a plurality of hollow fins 114. In particular, the interior of the fins 114 are hollow to increase the surface area within the housing 102 (e.g., as compared to a heat sink including solid fins) without changing the overall size of the housing 102. This increased surface area within the housing 102 improves heat transfer for the electrical device 100 as hot air within the housing 102 (e.g., due to heat generated by the electrical component 104, etc.) is exposed to more surface area for dissipation of heat to ambient surroundings. The hollow fins 114, as opposed to solid fins, allow more heat to be removed from the system and improve the reduction of the temperature within the electrical device 100. While only the front section 106b includes the heat sink 108 in the illustrated embodiment, in other embodiments, other sections of the housing 102 may additionally or alternatively include the heat sink 108 (e.g., upper section 106a, side sections 106c and 106d, lower section 106e, and/or back plate 110, etc.).

In the illustrated embodiment, the fins 114 extend the length of the front section 106b of the housing 102 (e.g., from a top of the housing 102 to a bottom of the housing 102). The plurality of fins 114 are oriented in a parallel configuration and each fin 114 is rectangular in shape. While the fins 114 are hollow, each end of the fin 114 is sealed (e.g., closed) to protect the electrical component 104 from foreign materials that may otherwise enter the electrical device 100. It should be appreciated that the heat sink 108 may include other configurations and/or fins of other shapes within the scope of the present disclosure including fins extending less than the length of the front section 106b of the housing 102, fins shaped as pin fins, triangular fins, etc., fins in a staggered configuration, fins in a uniform spacing, fins in a non-uniform spacing, a corrugated heat sink, etc.

Figure 4:
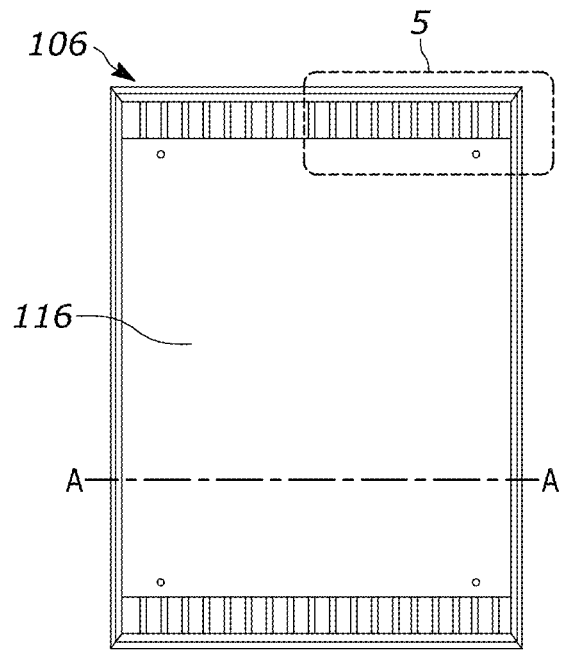
FIG. 4 is a rear view of the electrical device of FIG. 1 with a back plate of the housing and an internal electrical component removed to illustrate a cover plate included within the housing.

The electrical device 100 further includes a cover plate 116 coupled to the front section 106b of the housing 102. For example, the cover plate 116 may be coupled to the front section 106b of the housing 102 using fasteners (e.g., rivets, screws, etc.), an adhesive, etc. As shown in FIG. 4, the length of the cover plate 116 is less than the length of the front section 106b of the housing 102 (and less than the length of the fins 114). Due to the difference in length, the cover plate 116 defines openings 118 (e.g., passageways, etc.) between the interior of the housing 102 (e.g., the area between the cover plate 116 and the back plate 110 and including the electrical component 104) and the interior of the hollow fins 114. In particular, the cover plate 116 prevents access to the interior of the hollow fins 114 from the interior of the housing 102, except through the openings 118 (e.g., air may only enter the hollow fins 114 via the openings 118). As shown in FIGS. 4-5, an opening 118 is located within the housing 102 at each end of each fin 114 (e.g., near the top of the fin 114 and the bottom of the fin 114). In this way, each hollow fin 114, in combination with the cover plate 116, forms a duct (broadly, a channel) for air to flow from the interior of the housing 102 into and through the hollow fin 114. It should be appreciated that the cover plate 116 may be formed from any suitable material within the scope of the present disclosure including, for example, metal such as aluminum, stiff metals, non-metals such as plastic, wood, paper film, etc. It should be also appreciated that in other embodiments the cover plate 116 may be equal in length to the front section 106b of the housing 102, for example, rather that shorter in length, and include openings therein that align with the ends of the fins 114 (e.g., where the openings within the cover plate 116 define the openings 118, etc.).

Figure 6:
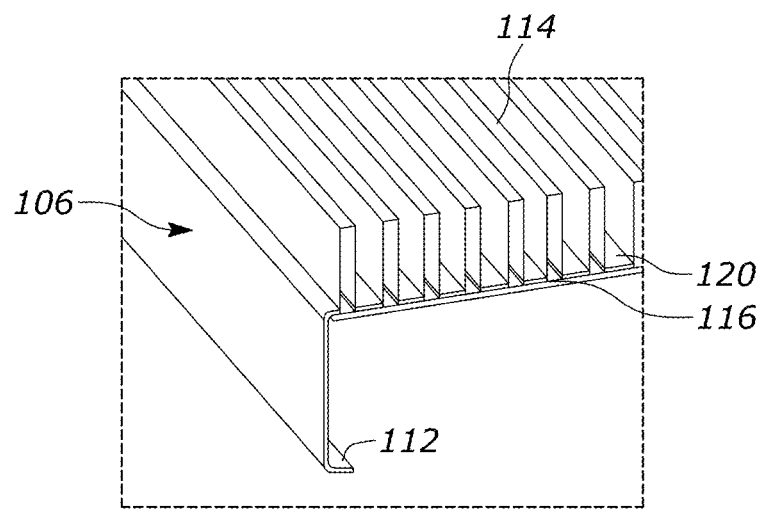
FIG. 6 is a sectional isometric view of the electrical device illustrated in FIG. 4, taken along axis A-A.

As shown in FIG. 6, which illustrates a cross-section of the first portion 106 of the housing 102 and the cover plate 116 coupled thereto, the cross-section of the heat sink 108 in the illustrated embodiment generally includes a square wave pattern, with each fin 114 defining a peak of the wave and a trench 120 existing between each fin 114. In particular, the cover plate 116 is coupled to the first portion 106 of the housing at each of the trenches 120 to define the ducts through which air may flow (e.g., in a convection current). In the illustrated embodiment, the fins 114 are equally spaced along a width of the first portion 106 of the housing 102. However, in other embodiments, the fins 114 are not uniformly spaced.

Figure 7:
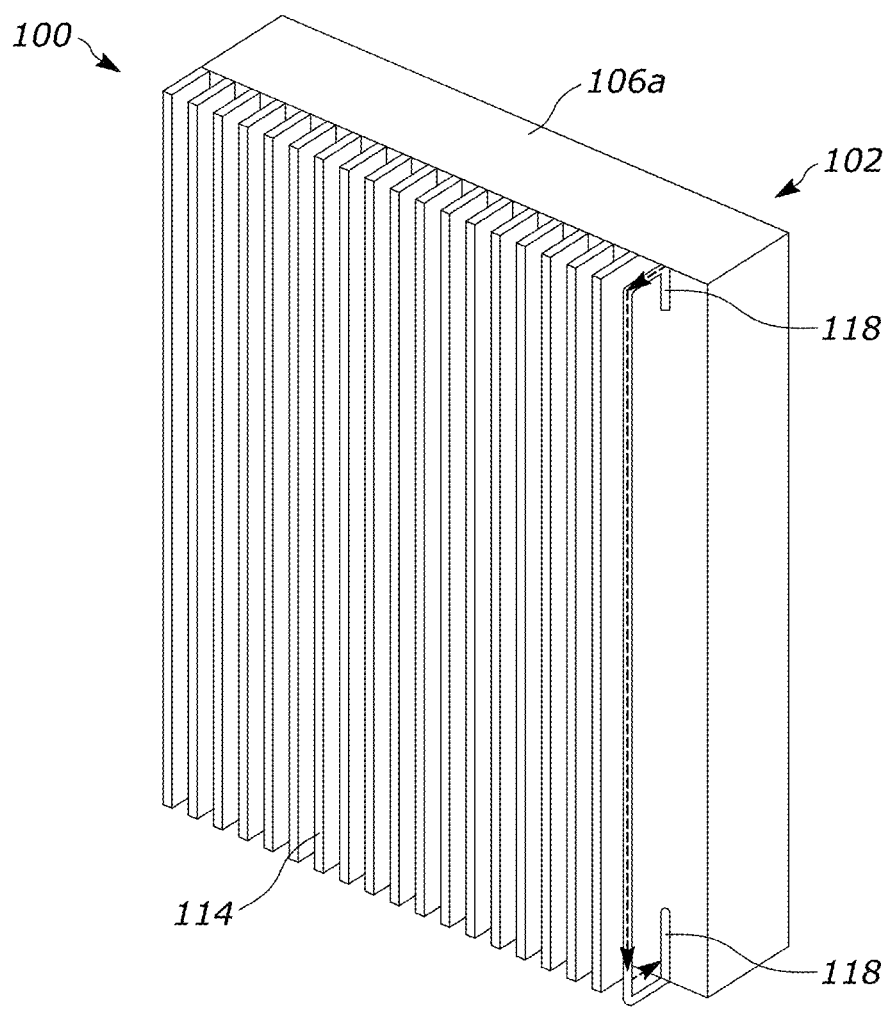
FIG. 7 is a front perspective view of the electrical device of FIG. 1 including notional streamlines of the convection current within a hollow fin of a heat sink.
Figure 8:
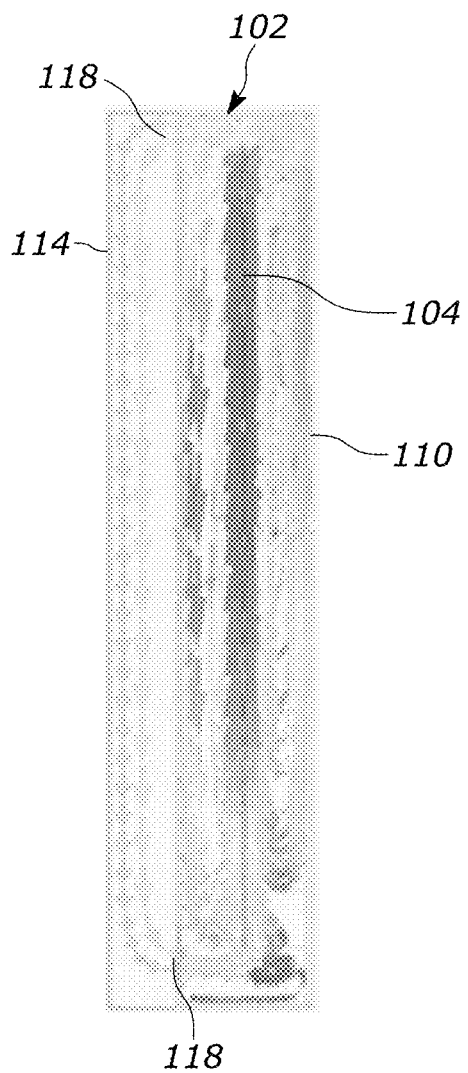
FIG. 8 is a side view of the electrical device of FIG. 1 including notional streamlines of the convection current within the housing and hollow fins of the heat sink.

As described above, with the cover plate 116 coupled to the housing 102, each hollow fin 114 serves as a duct (e.g., a channel) through which air is permitted to flow, for example, in a convection current as shown in FIGS. 7-8. In particular, during operation of the electrical device 100, the electrical component 104 generates heat, which in turn increases the temperature of the air surrounding the electrical component 104 within the housing 102. Based on buoyancy principles, the higher temperature air rises within the housing 102 (e.g., generally from the lower section 106e of the housing 102 towards the upper section 106a of the housing 102), resulting in a stream of air propelled upwards by thermal convection. In particular, this convection current (e.g., a thermally produced vertical air flow), upon reaching the upper section 106a of the housing 102, is directed through the openings 118 located towards the upper ends of the hollow fins 114 and into the hollow fins 114. As the air passes through the hollow fin 114 (e.g., through the duct defined by the hollow fin 114 and the cover plate 116), the temperature of the air within the hollow fin 114 decreases due to convection, conduction, and radiation. The air then flows back into the interior of the housing 102 through the openings 118 located towards the lower ends of the hollow fins 114, where the air flow pattern described above generally repeats. In this way, air flow is induced within the interior of the housing 102 and through the hollow fins 114, resulting in improved thermal performance of the electrical device 100 through natural convection, without reliance on a power or an active device (e.g., a fan) to cool the electrical device 100. The inclusion of ducts (e.g., as defined by the hollow fins 114 and the cover plate 116) decrease the temperature of the electrical component 104 by at least 6° C. As the openings 118 direct hot air within the housing 102 into the hollow fins 114 (e.g., which are generally cooler than the interior of the housing 102), more heat is drawn away from the electrical component 104 and air velocity through the fins 114 is increased, resulting in more heat being transferred to the external surfaces of the fins 114 (and more broadly, the external surfaces of the housing 102).

Figure 10:
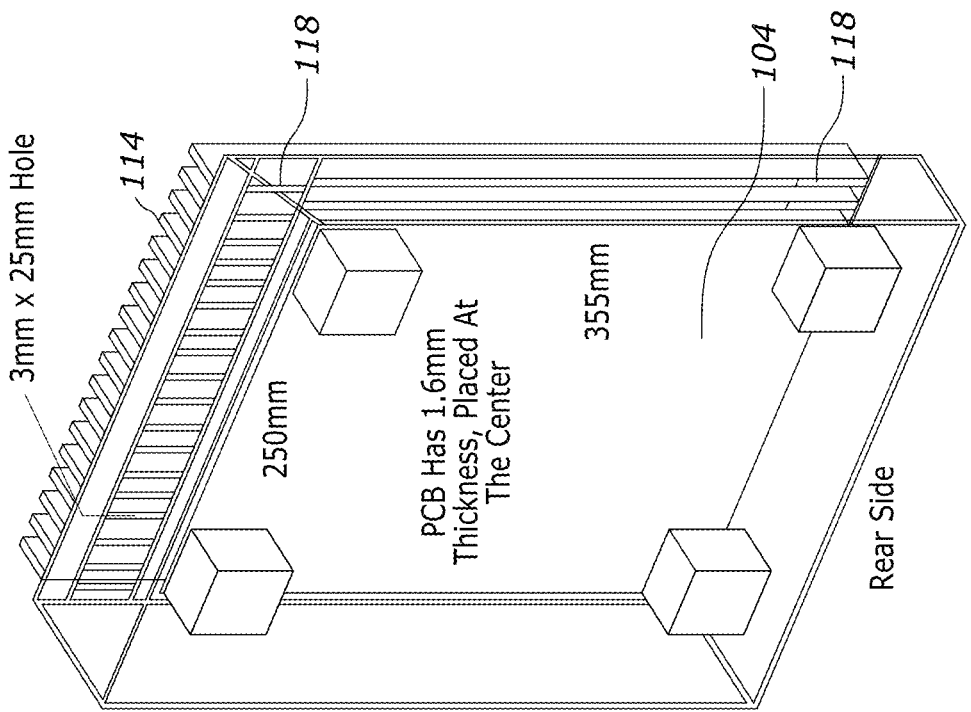
FIG. 10 is a rear perspective view of the electrical device of FIG. 1 with a portion of the housing removed to illustrate the internal components of the electrical device.
Figure 9:
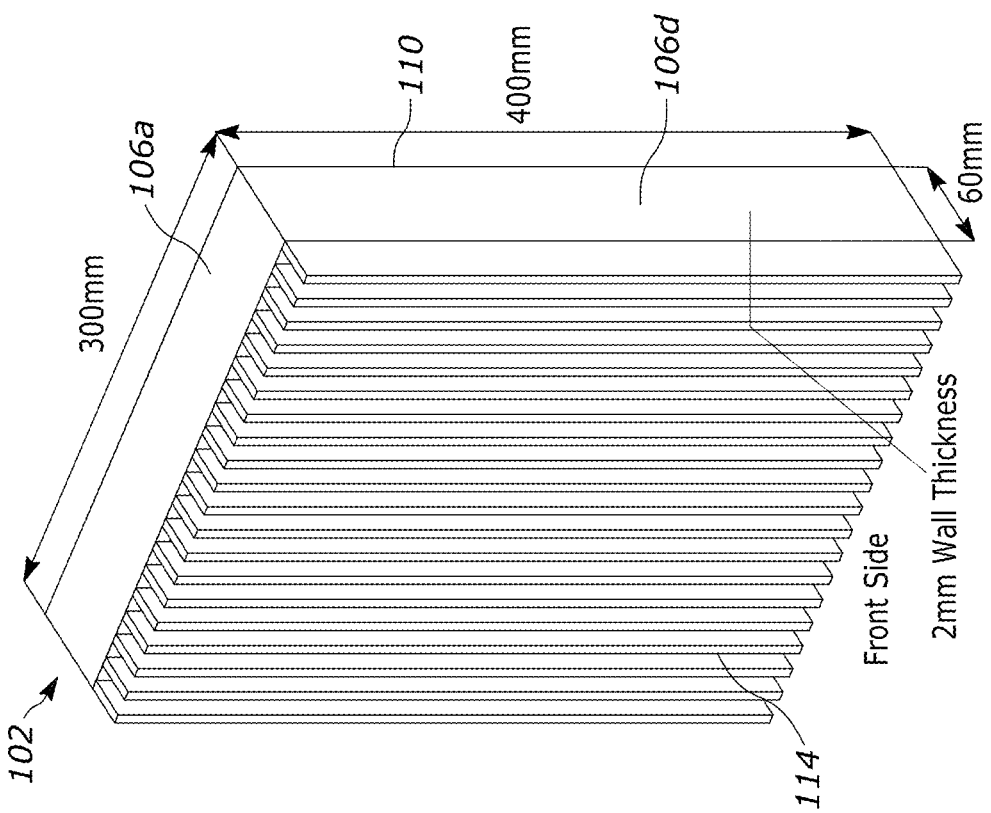
FIG. 9 is a front perspective view of the electrical device of FIG. 1.

With reference to FIGS. 9-10, example dimensions of the electrical device 100 are provided. The dimensions provided herein are exemplary in nature and do not limit the scope of the present disclosure. In the illustrated embodiment, the length of the housing 102 is 400 mm (e.g., the height of front section 106b, side sections 106c, 106d, and back plate 110, etc.), the width of the housing 102 is 300 mm (e.g., the width of top section 106a, front section 106b, bottom section 106e, and back plate 110, etc.), and the depth of the housing 102 is 60 mm (e.g., the width of side sections 106c, 106d, etc.). The thickness of the walls of the housing 102 is 2 mm (e.g., the thickness of the housing 102 excluding the heat sink 108, etc.). The electrical component 104, positioned within the center of the housing 102, is 355 mm in length and has a width of 250 mm. The openings 118 at the top and bottom of each fin 114 (e.g., defined by the cover plate 116) are 3 mm wide and 25 mm tall (e.g., such that the cover plate 116 has a length of 350 mm). The height of the fins 114 is 30 mm and the fin wall thickness is 0.5 mm. In the illustrated embodiment, twenty fins 114 are included in the heat sink 108. In other embodiments, a greater or lesser number of fins 114 may be included within the heat sink 108 without departing from the scope of the present disclosure. The dimensions of the fins 114 may be optimized to reduce the cost and weight of the electrical device 100.

Figure 11:
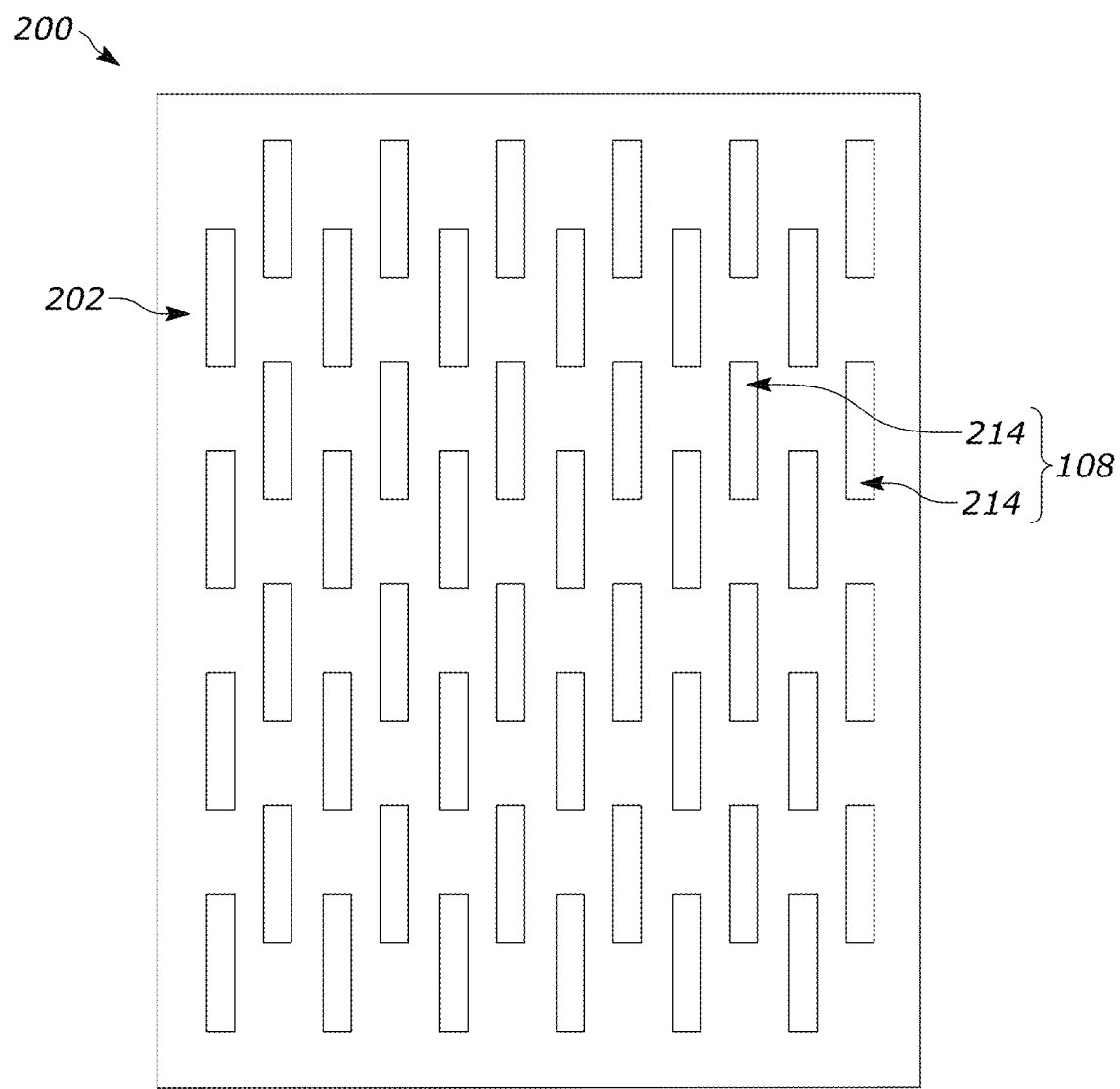
FIG. 11 is front view of another example embodiment of an electrical device.
Figure 12:
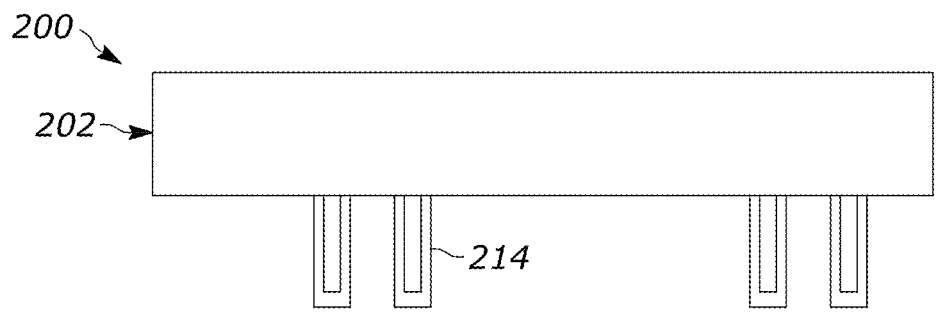
FIG. 12 is a top view of the electrical device of FIG. 11 taken along a horizontal section plane of the electrical device in order to illustrate the structure of the fins, with several fins omitted for clarity purposes.

FIGS. 11-12 illustrate another example embodiment of an electrical device 200 including one or more aspects of the present disclosure. The electrical device 200 of this embodiment is substantially similar to the electrical device 100 previously described and illustrated in FIGS. 1-10. For example, the electrical device 200 includes a housing 202 including an electrical component included therein (e.g., similar to electrical component 104), and a heat sink 208 included on the housing 202. The heat sink 208 of this embodiment includes fins 214 which are hollow.

In this example embodiment, the fins 214 are pin fins (e.g., do not extend the entire length of the housing 202) and are disposed in a staggered arrangement. Although not shown, a cover plate in this example embodiment is coupled to the housing 202 (e.g., within the housing 202 and behind the heat sink 208, similar to cover plate 116) to define ducts within the housing 202 (e.g., through the fins 214). In particular, the cover plate in this example embodiment includes openings that align with a top end and a bottom end of each hollow pin fin 214. In this way, each fin 214, in combination with the cover plate, forms a duct to direct air from within the housing 202 through the hollow pin fin 214 (e.g., to improve the efficiency of the convection current within the housing 202). In the illustrated embodiment, forty-eight hollow pin fins 214 are shown (and accordingly, ninety-six openings would be included in the cover plate, etc.). However, in other embodiments, a greater or lesser number of fins 214 may be included within the heat sink 208.

Electrical devices of the present disclosure may allow for improved thermal performance through specific structural configurations of their housings. In particular, the housing improves the thermal performance of the electrical device (e.g., reduce the temperature of the electrical component(s) included therein) by increasing the surface area to allow more heat to dissipate ambient (e.g., by including a heat sink with hollow fins) and by improving the air circulation around the electrical component within the housing utilizing buoyancy principles (e.g., by creating a channel or duct for air to travel through the hollow fins). These improvements are achieved without increasing the size of the housing (e.g., thermal performance is improved within an existing size of an electrical device, etc.). Hollow fins further reduce the weight of the electrical devices (e.g., as compared to solid fins). Moreover, the electrical devices of the present disclosure utilize natural convection and conduction for improved thermal efficiency without requiring power or an active device (e.g., a fan) to reduce the temperature of electrical component(s) included within the electrical devices.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" as well as the phrase "at least one of" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper", "lower" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the present disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the present disclosure, and all such modifications are intended to be included within the scope of the present disclosure.

The invention claimed is:

1. An electrical device with buoyancy-enhanced cooling, the electrical device comprising:
   a housing defining an interior;
   one or more fins extending away from the housing, at least one fin defining an at least partially hollow fin interior;
   a cover plate partially separating the fin interior and the housing interior, the cover plate defining two or more openings, each opening connecting a corresponding fin interior with the interior of the housing; and
   an electrical component disposed within the interior of the housing and configured to heat air within the interior of the housing.

2. The electrical device of claim 1, wherein the two or more openings include a first opening and a second opening, the first opening positioned below the second opening, and the housing, the cover plate, and the one or more fins together configured to direct the air heated by the electrical component through the one or more fins from the first opening to the second opening by buoyancy forces.

3. The electrical device of claim 1, wherein at least the one or more fins and the interior of the housing are configured such that air heated by the electrical component is to circulate through the one or more fins by buoyancy forces.

4. The electrical device of claim 1, wherein the one or more fins extend along a length of the housing.

5. The electrical device of claim 4, wherein the length of the cover plate is less than the length of the housing, each given opening defined based on a difference in length between the cover plate and the housing.

6. The electrical device of claim 1, wherein at least one fin is one of: a hollow pin fin, a hollow triangular profile fin, or a corrugated heat sink fin.

7. The electrical device of claim 1, wherein a first portion of the housing includes the one or more fins, the first portion of the housing formed as a single undivided piece.

8. The electrical device of claim 1, wherein the cover plate is comprised of aluminum.

9. The electrical device of claim 1, wherein the electrical device is a rectifier and the electrical component includes a rectifier circuit.

10. An electrical device with buoyancy-enhanced cooling, the electrical device comprising:
a housing defining a first end, a second end, and a housing interior;
a cover plate disposed at least partially in the housing interior;
an electrical component disposed within the housing interior; and
at least one duct defined at least in part by the cover plate, the at least one duct extending from the first end of the housing to the second end of the housing, each duct configured to direct air from the housing interior at the first end of the housing through a corresponding duct to the second end of the housing based on buoyancy forces.

11. The electrical device of claim 10, wherein the housing further defines a plurality of sidewall sections, each duct coupled to at least two sidewall sections.

12. The electrical device of claim 10, wherein the cover plate is carried at least partially within the housing, the cover plate at least partially separating the at least one duct from the housing interior, the cover plate defining at least one plate opening, each plate opening communicating with the housing interior and a respective duct.

13. The electrical device of claim 12, wherein a length of the cover plate is less than a length of the housing, each given opening defined based on a difference in length between the cover plate and the housing.

14. The electrical device of claim 10, wherein a given duct is defined by a corresponding fin, a given fin defining an at least partially hollow fin interior.

15. The electrical device of claim 10, wherein the at least one duct and the housing interior are configured such that heat generated during the operation of the electrical component is to circulate through the at least one duct by buoyancy forces.

16. The electrical device of claim 10, wherein the electrical component is a rectifier.

17. An electrical device comprising:
a housing defining a housing interior, the housing interior having a fluid therewithin;
an electrical component disposed within the housing interior, the electrical component configured such that heat is generated during operation thereof, thereby heating the fluid within the housing interior;
at least one fin extending away from the housing, the at least one fin defining an at least partially hollow fin interior in fluid communication with the housing interior; and
a cover plate partially separating the fin interior and the housing interior, the cover plate defining one or more openings, each respective opening in fluid communication with a corresponding fin interior and with the housing interior, the housing interior, the at least one fin, and the cover plate together configured such that the heated fluid is able to circulate therethrough based on buoyancy forces.

18. The electrical device of claim 17, wherein the one or more fins extend along a length of the housing, the length of the cover plate is less than the length of the housing, each given opening defined based on a difference in length between the cover plate and the housing.

19. The electrical device of claim 17, wherein each given fin is one of: a hollow pin fin, a hollow triangular profile fin, or a corrugated heat sink fin.

20. The electrical device of claim 17, wherein the fluid is air.

* * * * *